United States Patent
Nakada et al.

(10) Patent No.: US 9,628,689 B2
(45) Date of Patent: Apr. 18, 2017

(54) IMAGE PICKUP ELEMENT UNIT AND IMAGE PICKUP APPARATUS WITH HEAT GENERATING MEMBER

(71) Applicant: Hitachi Kokusai Electric Inc., Tokyo (JP)

(72) Inventors: Shigeo Nakada, Tokyo (JP); Hiromu Matsumoto, Tokyo (JP); Makoto Inagaki, Tokyo (JP); Hiroyuki Mori, Tokyo (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/907,841

(22) PCT Filed: Sep. 27, 2013

(86) PCT No.: PCT/JP2013/076317
§ 371 (c)(1),
(2) Date: Jan. 27, 2016

(87) PCT Pub. No.: WO2015/045110
PCT Pub. Date: Apr. 2, 2015

(65) Prior Publication Data
US 2016/0165115 A1     Jun. 9, 2016

(51) Int. Cl.
*H04N 5/232* (2006.01)
*G03B 17/55* (2006.01)
*H04N 5/225* (2006.01)

(52) U.S. Cl.
CPC .......... *H04N 5/232* (2013.01); *G03B 17/55* (2013.01); *H04N 5/2251* (2013.01); *H04N 5/2252* (2013.01); *H04N 5/2257* (2013.01)

(58) Field of Classification Search
CPC ..................................................... H04N 5/232
USPC .................................................. 348/374, 143
See application file for complete search history.

(56) References Cited

U.S. PATENT DOCUMENTS

| 5,508,740 A * | 4/1996 | Miyaguchi ............. H01L 23/34 257/E23.08 |
| 2004/0232535 A1* | 11/2004 | Tarn .................... B81C 1/00269 257/680 |

FOREIGN PATENT DOCUMENTS

| JP | 05-022671 A | 1/1993 |
| JP | 09-037161 A | 2/1997 |
| JP | 2008-211378 A | 9/2008 |

OTHER PUBLICATIONS

International Search Report of PCT/JP2013/076317.

* cited by examiner

*Primary Examiner* — Joel Fosselman
(74) *Attorney, Agent, or Firm* — Mattingly & Malur, PC

(57) ABSTRACT

This image pickup element unit is provided with: an image pickup element substrate having mounted thereon an image pickup element that converts inputted light into electric signals; and a temperature adjusting member for adjusting the temperature of the image pickup element. The image pickup element unit is configured such that: the temperature adjusting member is configured to have a recessed section, and include a left-side member, a right-side member, an upper-side member, a lower-side member, and a rear-side member of the recessed section; the image pickup element is disposed to be surrounded by the left-side member, the right-side member, the upper-side member, the lower-side member, and the rear-side member; and the image pickup element unit is attached to the image pickup element substrate by having the rear-side member therebetween.

10 Claims, 7 Drawing Sheets

IMAGE PICKUP ELEMENT UNIT AND IMAGE PICKUP APPARATUS WITH HEAT GENERATING MEMBER

TECHNICAL FIELD

The present invention relates to a heat dissipation technique and a heatup technique for an image pickup element unit for use in a surveillance camera or the like and an image pickup apparatus (a camera) which uses the image pickup element unit.

BACKGROUND ART

Image pickup apparatus (hereinafter simply referred to as a camera) which uses an image pickup element such as a Charge Coupled Device (CCD) image sensor is installed in various sites including outdoor places for the purposes of crime prevention and keeping track of ambient situations and video images taken by the camera are monitored.

When an image pickup element such as CCD is electrified, its temperature rise occurs by heat generated by electricity. If the element's temperature rises excessively, white spots increase or a dark current inside the image pickup element increases and the quality of video images taken deteriorates. For this reason, a performance assurance temperature range is specified for an image pickup element. The camera is equipped with a cooling mechanism to suppress the temperature rise of the image pickup element within the specified range.

Some camera of background art has a structure in which a cooling plate is placed in close contact with an image pickup element and the cooling plate is fixed to the camera hosing. Heat of the image pickup element is thus conducted to the cooling plate and further conducted to the camera hosing, thereby decreasing the increased temperature of the image pickup element. Besides, cooling is also performed with a Peltier element attached to the image pickup element (refer to PTL 1).

However, one side of the Peltier element is cooled, whereas its other side heats up. Hence, the image pickup element is cooled by one side of the Peltier element, but the inside of the camera hosing is heated by the other side of the Peltier element; therefore, it is not easy to improve the efficiency of cooling the entire image pickup element.

Besides, in a case where the camera is used in a low-temperature environment (e.g., around −25° C.) or in a case where the camera is installed in a site where it is forcibly exposed to cold wind at all times, heating measures or the like are needed to make the temperature of the image pickup element fall within the performance assurance temperature range. However, for the structure of the cooling plate of the camera of background art, it is not easy to provide a heating means and perform heating efficiently.

CITATION LIST

Patent Literature

PTL 1: Japanese Patent Application Laid-Open No. Hei9-37161

SUMMARY OF INVENTION

Technical Problem

An object of the present invention is to provide a technique that can make the temperature of an image pickup element for use in a camera fall within a specified temperature range.

Solution to Problem

In order to address the above-noted problem, a representative configuration of an image pickup element unit pertaining to the present invention is as follows:

an image pickup element unit including an image pickup element substrate having an image pickup element to convert incident light into electric signals mounted thereto and a temperature adjusting member for adjusting the temperature of the image pickup element.

The image pickup element unit in which:

the temperature adjusting member has a recessed section and is configured to include a left side member, a right side member, a top side member, a bottom side member, and a rear side member with respect to the recessed section;

a heat generating member is installed in the left side member or the right side member; and the image pickup element is placed so as to be surrounded by the left side member, the right side member, the top side member, the bottom side member, and the rear side member and is fixed to the image pickup element substrate with the intermediate positioning of the rear side member.

Besides, in order to address the above-noted problem, a representative configuration of a camera (image pickup apparatus) pertaining to the present invention is as follows:

an image pickup apparatus including an image pickup element substrate having an image pickup element to convert incident light into electric signals mounted thereto, a signal processing substrate which processes electric signals from the image pickup element, a temperature adjusting member for adjusting the temperature of the image pickup element, and a housing which houses the image pickup element substrate, the signal processing substrate, and the temperature adjusting member.

The image pickup apparatus in which:

the temperature adjusting member has a recessed section and is configured to include a left side member, a right side member, a top side member, a bottom side member, and a rear side member with respect to the recessed section;

a heat generating member is installed in the left side member or the right side member; and the image pickup element is placed so as to be surrounded by the left side member, the right side member, the top side member, the bottom side member, and the rear side member and is fixed to the image pickup element substrate with the intermediate positioning of the rear side member.

Advantageous Effects of Invention

Configurations made as described above would enable it to make the temperature of an image pickup element for use in a camera fall within a specified temperature range.

DESCRIPTION OF EMBODIMENTS

First Embodiment

Overview of a Camera Structure

Figure 1:
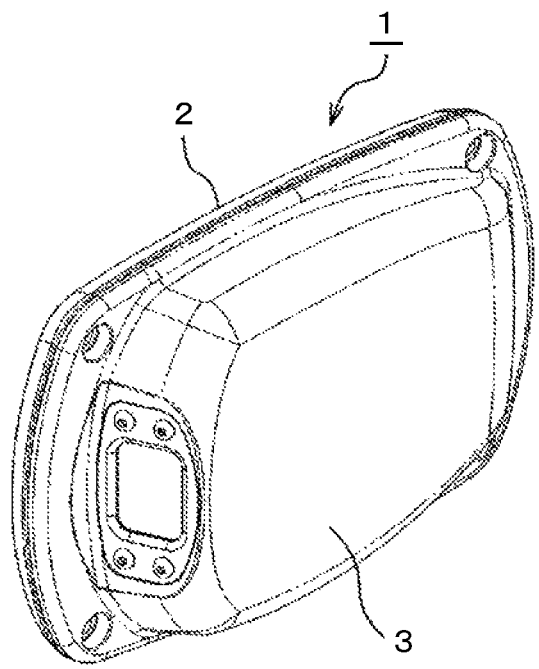
FIG. 1 is an external appearance view of a camera according to a first embodiment of the present invention.
Figure 2:
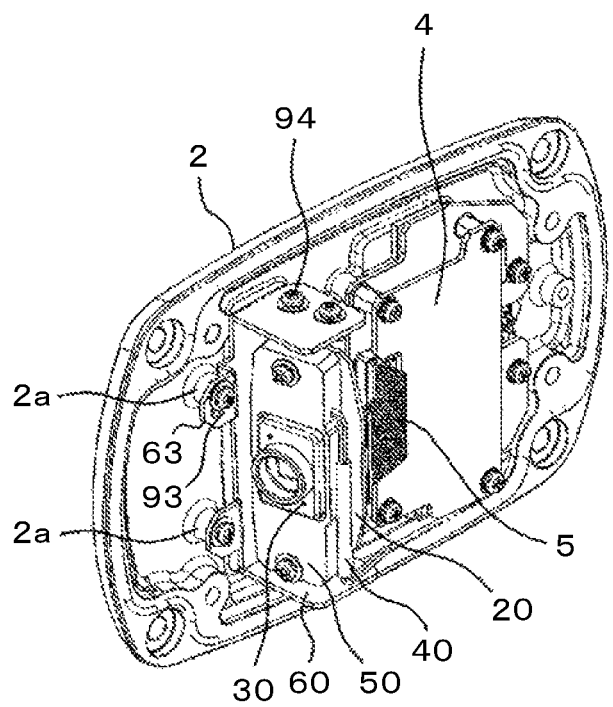
FIG. 2 is a view of the camera with its cover opened.

First, using FIGS. 1 and 2, descriptions are provided about an overview of the structure of a camera (image pickup apparatus) according to a first embodiment of the present invention. FIG. 1 is a perspective view depicting external appearance of the camera according to the first embodiment of the present invention. FIG. 2 is a perspective view depicting the camera with its cover opened according to the first embodiment of the present invention.

In FIG. 1, reference numeral 1 denotes a camera; 2 denotes a camera housing; and 3 denotes a cover which covers over all parts of the camera 1. The housing 2 and the cover 3 are made of aluminum which is highly thermal conductive. The cover 3 may be considered to be included in the housing 2. In FIG. 2, reference numeral 30 denotes a lens unit including an imaging lens 32 (see FIG. 5) and this unit is fixed to an image pickup element unit 70 (see FIG. 3). Reference numeral 40 denotes a heater unit which is a heating means for heating an image pickup element 21 (see FIG. 5) within the image pickup element unit 70. Reference numerals 50 and 60 denote a first fixing bracket and a second fixing bracket, respectively, which are used to fix the image pickup element unit 70 to the housing 2.

Reference numeral 20 denotes an image pickup element substrate to which the image pickup element 21 is mounted. The image pickup element 21 converts incident light into electric signals. Reference numeral 4 denotes a signal processing substrate which processes electric signals from the image pickup element 21. More specifically, the signal processing substrate 4 generates video image signals based on electric signals from the image pickup element 21, performs image correction processing such as white balance on the video image signals, compression encodes the image-corrected signals, and outputs them to a display device external to the camera 1. Reference numeral 5 denotes a wiring cable connecting the image pickup element substrate 20 and the signal processing substrate 4 for allowing signal transfer between them.

As mentioned above, the camera 1 of the first embodiment is configured to include the housing 2, cover 3, lens unit 30, image pickup element unit 70 (including the heater unit 40), signal processing substrate 4, first fixing bracket 50, and second fixing bracket 60. The lens unit 30, image pickup element unit 70, signal processing substrate 4, first fixing bracket 50, and second fixing bracket 60 are housed in the housing 2. The signal processing substrate 4 may be configured to be included in and integrally with the image pickup element substrate 20.

Image Pickup Element Unit 70

Figure 3:
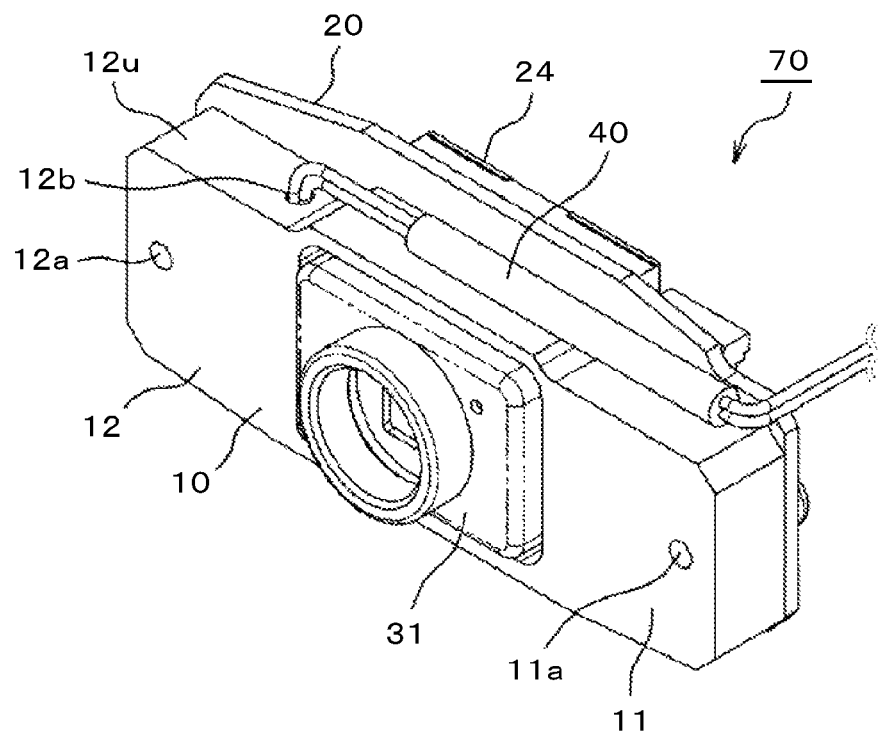
FIG. 3 is a perspective view depicting an image pickup element unit according to the first embodiment of the present invention.
Figure 4:
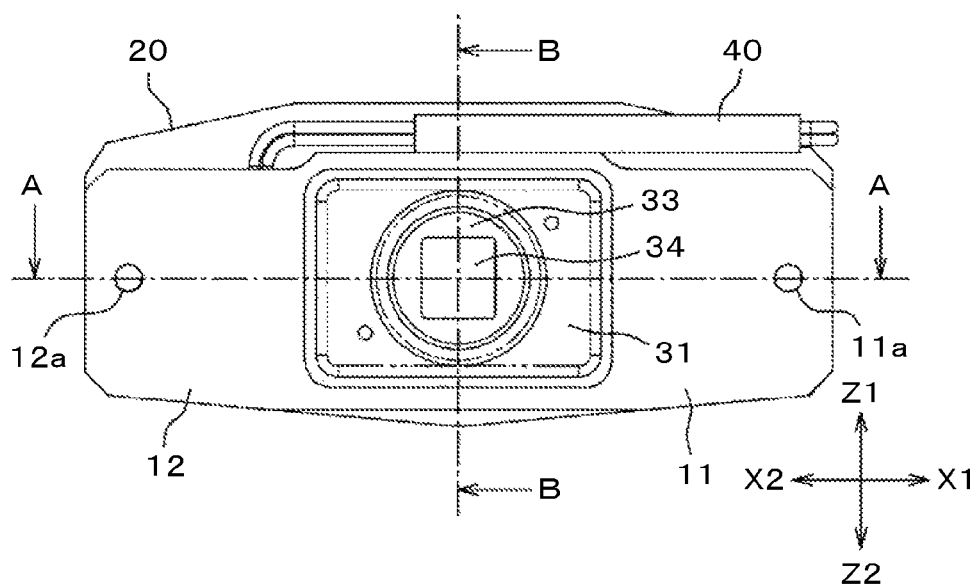
FIG. 4 is a front view of the image pickup element unit in FIG. 3.
Figure 5:
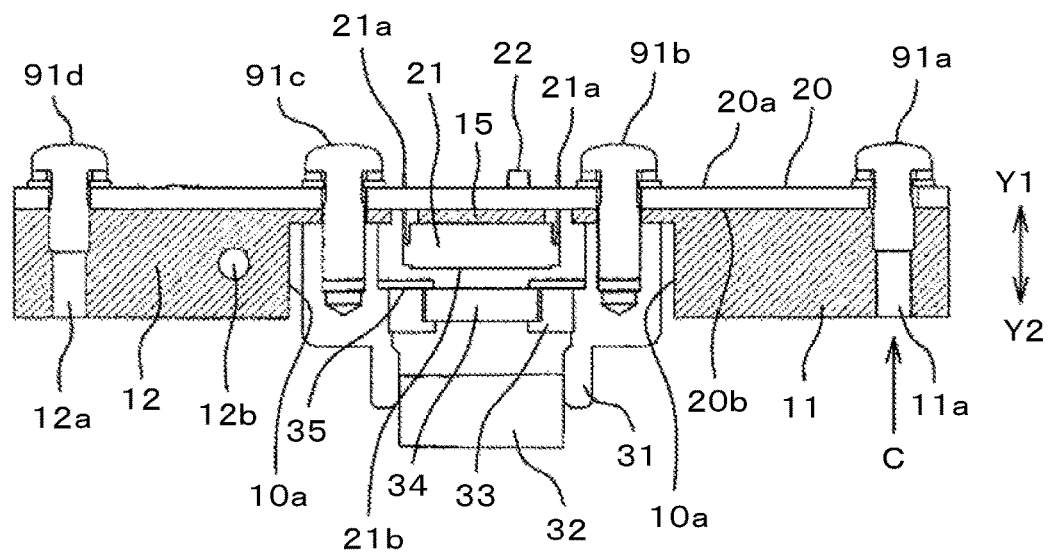
FIG. 5 is a cross-sectional view through line A-A in FIG. 4.
Figure 6:
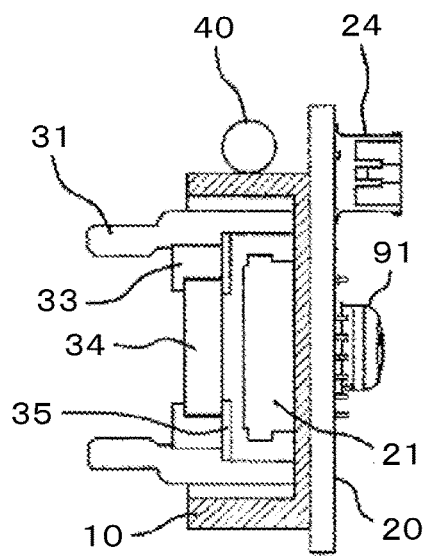
FIG. 6 is a cross-sectional view through line B-B in FIG. 4.
Figure 7:
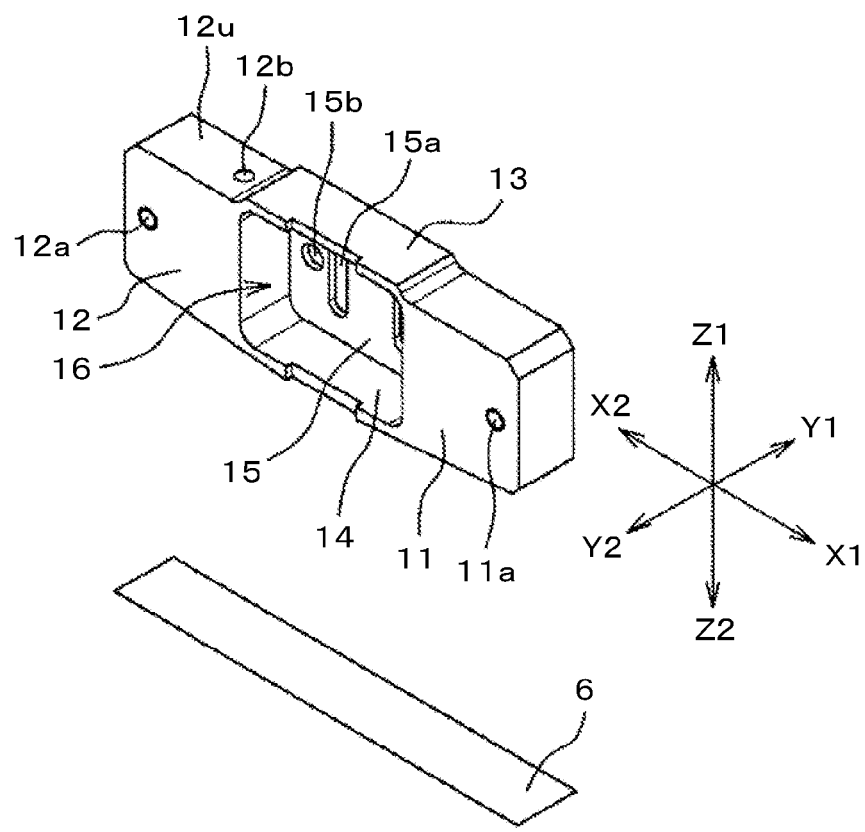
FIG. 7 is a perspective view depicting a temperature adjusting block according to the first embodiment of the present invention.

Next, using FIGS. 3 to 7, descriptions are provided about the image pickup element unit 70 according to the first embodiment of the present invention. FIG. 3 is a perspective view depicting the image pickup element unit according to the first embodiment of the present invention. FIG. 4 is a front view of the image pickup element unit in FIG. 3. FIG. 5 is a cross-sectional view through line A-A in FIG. 4. FIG. 6 is a cross-sectional view through line B-B in FIG. 4. FIG. 7 is a perspective view depicting a temperature adjusting block 10 according to the first embodiment of the present invention.

As depicted in FIGS. 3 to 7, the image pickup element unit 70 is configured to include a temperature adjusting block (temperature adjusting member) 10, the image pickup element substrate 20 having the image pickup element 21 mounted thereto, and a heater unit 40. The lens unit 30 may be included in the image pickup element unit 70. The temperature adjusting block 10 is a member for adjusting the temperature of the image pickup element 21 and is made of aluminum which is highly thermal conductive. The image pickup element substrate 20 is made of, e.g., glass epoxy resin.

As depicted in FIG. 7, the temperature adjusting block 10 has a recessed section 16 for housing the image pickup element 21, lens unit 30, etc. in its central part. This block has a right cuboidal part 11 and a left cuboidal part 12 of the block at the right and left of the recessed section 16, respectively. The block also has a top plate part 13 and a bottom plate part 14 of the block over and under the recessed section 16, respectively. The block also has a rear plate part 15 of the block in the back (toward direction Y1) of the recessed section 16. The right part 11 and left part 12 of the block are linked through the top part 13, bottom part 14, and rear part 15 of the block. The right part 11, left part 12, top part 13, bottom part 14, and rear part 15 of the block define a non-recessed body of the temperature adjusting block 10.

In the present specification, top, bottom, left, right, and rear correspond to directions Z1, Z2, X2, X1, and Y1 given in FIG. 7 and FIGS. 4 and 5 in order.

In the left part 12 of the block, a heater insert hole 12b which is a blind and columnar hole is provided to extend downward from its top surface 12u. A heater (heat generating member) 41 of the heater unit 40 is inserted into the heater insert hole 12b. The diameter of the heater insert hole 12b is substantially equal in size to the diameter of the heater 41 and the insert hole is formed so that the outer wall of the heater 41 comes in contact with the inner wall of the heater insert hole 12b when the heater 41 has been inserted into the heater insert hole 12b. Description about the heater unit 40 will be provided later.

In the right part 11 and the left part 12 of the block, a screw hole 11a and a screw hole 12a are provided, respectively. Description about the screw hole 11a and screw hole 12a will be provided later.

In the rear part 15 of the block, two terminal through-holes 15a are provided to allow the terminals 21a of the image pickup element 21 to pass through. The terminal through-holes 15a are vertically elongated holes. In the rear part 15 of the block, two screw holes 15b are also provided. In FIG. 7, only one screw hole 15b is depicted. Description about the screw holes 15b will be provided later.

A heat dissipation sheet 6 is attached to the inside of the housing 2 beneath the temperature adjusting block 10. The heat dissipation sheet 6 is placed between the second fixing bracket 60 which will be described later and the housing 2 and transfers the heat of the temperature adjusting block 10 to the housing 2 through the second fixing bracket 60. The heat dissipation sheet 6 is formed of a material in which both thermal conductance and electrical insulation are high; for example, a heat dissipation silicone rubber sheet supplied by Shin-Etch Chemical Co. Ltd. is used.

As depicted in FIGS. 5 and 6, the image pickup element 21 is mounted by soldering to the underside surface 20b of the image pickup element substrate 20. In the process of this mounting, it is arranged such that the rear part 15 of the temperature adjusting block 10 is interposed between the image pickup element 21 and the image pickup element substrate 20. The rear part 15 of the block is put in close contact with the image pickup element 21 and the image pickup element substrate 20 and absorbs the heat of the image pickup element 21 and transfers that heat to the right part 11 and the left part 12 of the block. Otherwise, the rear part 15 of the block transfers the heat of the left part 12 of the block to the image pickup element 21.

As noted above, a configuration is made such that the image pickup element 21 is placed inside the recessed section 16 provided in the temperature adjusting block 10 and the back surface (the surface contacting with the rear part 15 of the block) and lateral sides of the image pickup element 21 are surrounded by the temperature adjusting block 10. In other words, the image pickup element 21 is placed so as to be surrounded by the right part 11, left part 12, top part 13, bottom part 14, and rear part 15 of the block. Therefore, heat exchange between the back surface of the image pickup element 21 and the rear part 15 of the block can take place efficiently.

Moreover, the height of the image pickup element 21 was made lower than the height of every one of the right part 11, left part 12, top part 13, and bottom part 14 of the block. That is, with respect to a Y direction, the thickness of the non-recessed body of the temperature adjusting block 10 was made thicker than the thickness of the image pickup element 21; thus, the surface of the image pickup element 21 (the surface facing glass 34, i.e., the surface opposite to the rear part 15 of the block) can be placed completely inside the recessed section 16 and heat exchange between the surface of the image pickup element 21 and the temperature adjusting block 10 can take place efficiently.

Besides, the right part 11 and the left part 12 of the block were made thicker to make their heat capacity larger; thus, even in a case where heat transfer between the housing 2 and the right part 11 as well as left part 12 of the block is deteriorative as compared with heat transfer between the image pickup element 21 and the temperature adjusting block 10, the amount of heat exchange per unit time between the image pickup element 21 and the temperature adjusting block 10 is less likely to decrease. Hence, even in a case where the temperature of the image pickup element 21 has changed rapidly for a short time, it is possible to absorb the heat of the image pickup element 21 or heat the image pickup element 21 and suppress the rapid temperature change of the image pickup element 21.

On the surface 20a of the image pickup element substrate 20, opposite to the rear part 15 of the block, a temperature sensor 22 to detect the temperature of the image pickup element 21 is provided in a position close to the image pickup element 21. More specifically, the temperature sensor 22 is provided in a position facing the back surface of the image pickup element 21 with the intermediate positioning of the rear part 15 of the block. The temperature sensor 22 is electrically connected to the signal processing substrate 4 which will be described later. An arrangement is made so that no electric circuit is provided on the underside surface 20b of the image pickup element substrate 20, which contacts with the rear part 15 of the block, to put the underside surface in an electrically insulating state.

As depicted in FIGS. 5 and 6, the lens unit 30 is provided on the Y2-direction side of the image pickup element 21. The lens unit 30 is configured to include an imaging lens 32, a lens mount 31 supporting the imaging lens 32, glass 34 provided on the Y1-direction side of the imaging lens 32, a glass frame 33 supporting the glass 34, and a glass holder 35. The lens unit 30 is fixed to the image pickup element substrate 20 with screws 91b and 91c in such a manner as to sandwich the image pickup element 21 between it and the rear part 15 of the block. Threadless through-holes are made in the rear part 15 of the block and the image pickup element substrate 20 to allow the screws 91b and 91c to pass through and female screw holes threaded internally are made in the lens mount 31.

Besides, the right part 11 of the block and the image pickup element substrate 20 are fastened together with a screw 91a and the left part 12 of the block and the image pickup element substrate 20 are fastened together with a screw 91d. Threadless through-holes are made in the image pickup element substrate 20 to allow the screws 91a and 91d to pass through and female screw holes 11a and 12a threaded internally are made in the right part 11 and the left part 12 of the block, respectively.

As depicted in FIGS. 3 and 4, a heater cable 42 of the heater unit 40 is placed over the top surface of the temperature adjusting block 10 and the heater 41 (see FIG. 9) is inserted into the heater insert hole 12b. On the surface 20a of the image pickup element substrate 20, a connector 24 is provided for connection of the wiring cable 5 between the image pickup element substrate 20 as well as the signal processing substrate 4.

Fitting Structure of the Image Pickup Element Unit

Next, descriptions are provided about the fitting structure of the image pickup element unit into the housing, that is, the fitting structure of the temperature adjusting block into the housing.

Figure 8:
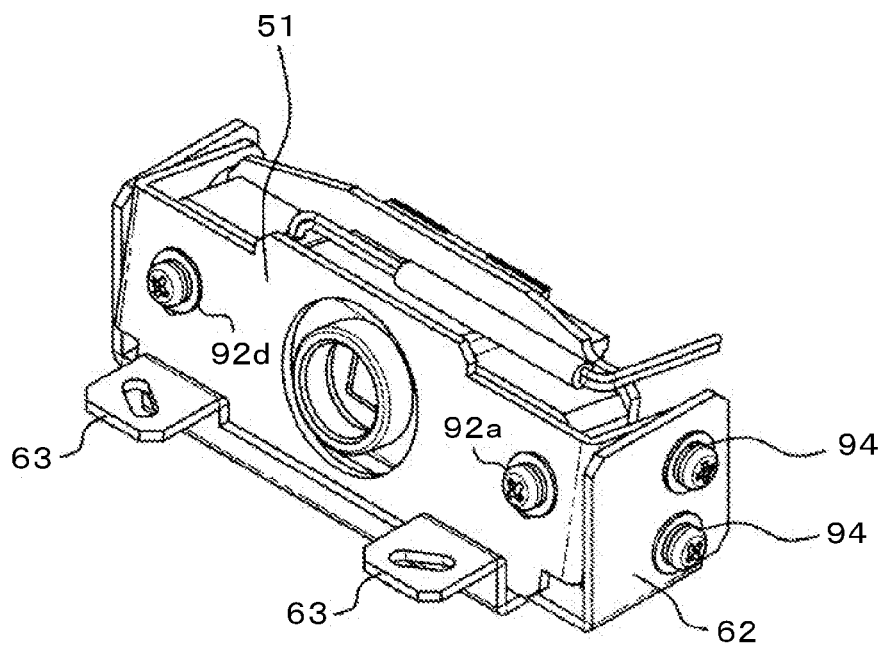
FIG. 8 is a perspective view depicting the temperature adjusting block with the fixing brackets attached thereto, according to the first embodiment of the present invention.
Figure 9:
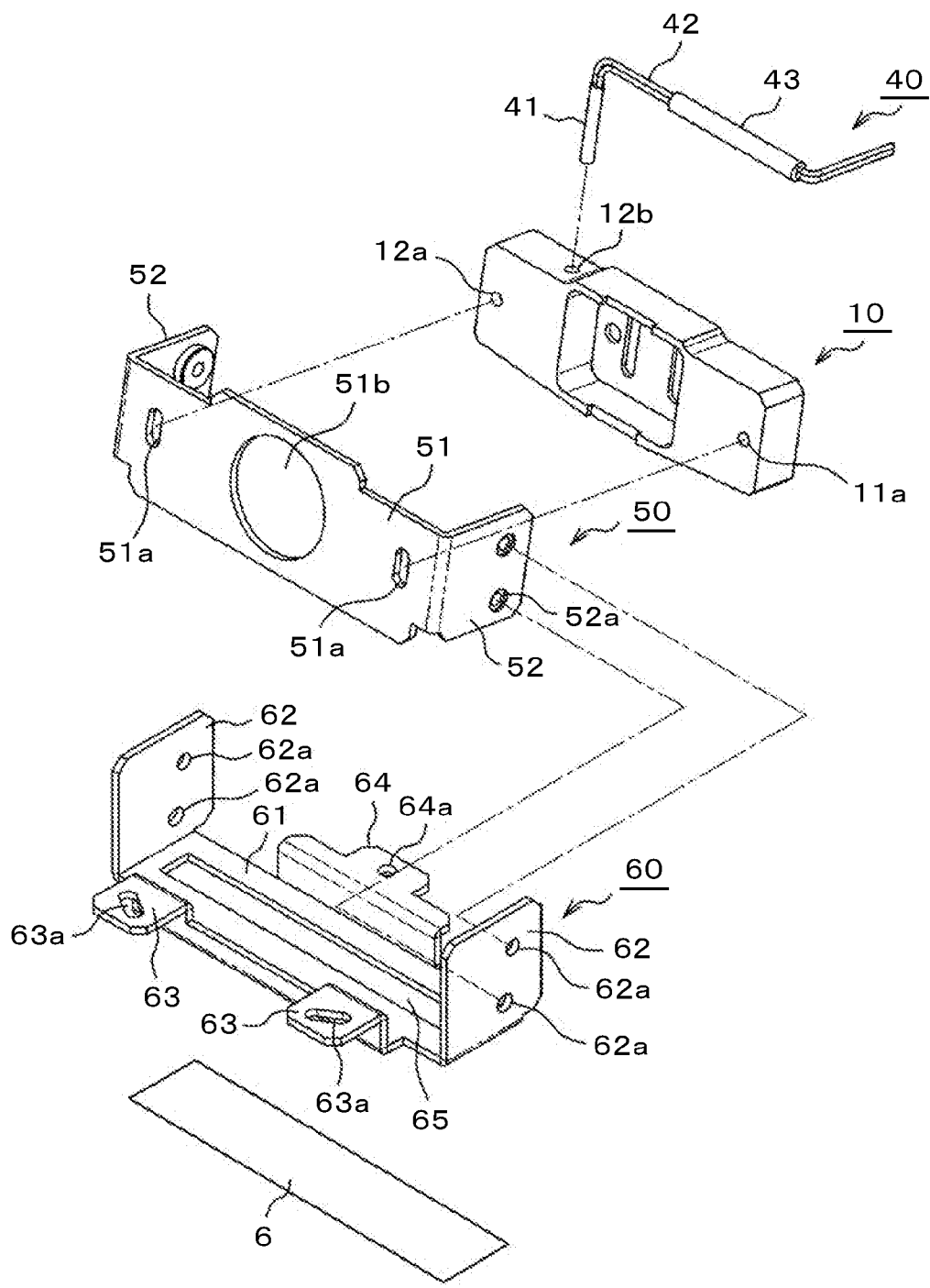
FIG. 9 is an exploded perspective view for explaining the fixing brackets according to the first embodiment of the present invention.

The temperature adjusting block 10 is fit into the housing 2 and fixed with the first fixing bracket 50 and the second fixing bracket 60. This fitting structure is described with FIGS. 8 and 9. FIG. 8 is a perspective view depicting the temperature adjusting block with the fixing brackets attached thereto, according to the first embodiment of the present invention. FIG. 9 is an exploded perspective view for explaining the fixing brackets according to the first embodiment of the present invention. In FIG. 9, the image pickup element substrate 20 and the lens unit 30 are omitted from depiction.

As depicted in FIG. 9, the first fixing bracket 50 looks like U shape when viewed from above (direction Z1) and has a front plate 51 and two side plates 52. The front plate 51 is a flat plate and has a circular lens hole 51b in its center and screw holes 51a near its right-hand and left-hand ends, respectively. The screw holes 51a are vertically elongated through-holes. By forming the screw holes 51a as vertically elongated through-holes, the position of the first fixing bracket 50, i.e., the position of the image pickup element unit 70 in an X-Z plane can be adjusted.

The side plates 52 are flat plates and each bend at right angle with the front plate 51 in the Y1 direction from the right and left ends of the front plate 51. The side plates 52 are attachment plates for setting the first fixing bracket 50 onto the second fixing bracket 60.

In the side plates 52, there are two screw holes 52a respectively which are vertically spaced from each other. The screw holes 52a are internally threaded screw holes.

As depicted in FIG. 9, the second fixing bracket 60 looks like U shape when viewed from front (direction Y2) and has a bottom plate 61 and two side plates 62. In the bottom plate 61, two bracket attachment lugs 63 protruding frontward are provided on its front edge and one bracket attachment lug 64 protruding backward is provided on the back edge (direction Y1) of the bottom plate 61. The bracket attachment lugs 63 and 64 are the attachments for setting the temperature adjusting block 10 onto the housing 2 with the intermediate positioning of the heat dissipation sheet 6.

In the bracket attachment lugs 63 and 64, there are screw holes 63a and 64a, respectively. The screw holes 63a are diagonally elongated through-holes. The screw hole 64a is a circular through-hole. By forming the screw holes 63a as diagonally elongated through-holes along a diagonal line on a plane surface of the bracket attachment lugs 63, the position of the second fixing bracket 60, i.e., the position of the image pickup element unit 70 in an X-Y plane can be adjusted.

As depicted in FIGS. 8 and 9, the temperature adjusting block 10 is fixed to the first fixing bracket 50 with screws 92a and 92d. More specifically, a screw 92a is screwed into a screw hole 11a (female screw hole) of the temperature adjusting block 10 through a screw hole 51a (through-hole) of the first fixing bracket 50 from an arrow-C direction given in FIG. 5. Likewise, a screw 92d is screwed into a screw hole 12a (female screw hole) of the temperature adjusting block 10 through a screw hole 51a (through-hole).

The first fixing bracket 50 is set onto the second fixing bracket 60 and fixed with four screws 94. More specifically, the screws 94 are screwed into screw holes 52a (female screw holes) of the first fixing bracket 50 through screw holes 62a (through-holes) of the second fixing bracket 60.

The second fixing bracket 60 is fixed to the housing 2 with the intermediate positioning of the heat dissipation sheet 6. More specifically, two screws 93 (see FIG. 2) are screwed into screw holes 2a (female screw holes; see FIG. 2) of the housing 2 through the screw holes 63a (through-holes) of the second fixing bracket 60. Likewise, a screw (not depicted) is screwed into a screw hole (female screw hole, not depicted) of the housing 2 through the screw hole 64a (through-hole) of the second fixing bracket 60.

Heater Unit

As depicted in FIG. 9, the heater (heat generating member) 41 of the heater unit 40 is inserted and fixed into the heater insert hole 12b of the temperature adjusting block 10. The heater 41 is, for example, a cartridge heater. The cartridge heater is a device in which a heating wire (e.g., nichrome wire) wound around a ceramic bar is inserted in a stainless pipe and gaps inside the pipe are filled with an insulating material (e.g., magnesium oxide). The heater 41 is connected to the signal processing substrate 4 by the heater cable 42. Thus, electric power for heating up the heater 41 is supplied from the signal processing substrate 4 through the heater cable 42. The outer periphery of the heater cable 42 is protected with a shock absorbing material 43.

As noted above, the heater 41 is so configured to be buried inside the left part 12 of the block, forming a part of the non-recessed body of the temperature adjusting block 10; thus, the heater 41 can be fixed stably and heat from the heater 41 can efficiently be transferred to the temperature adjusting block 10. Furthermore, in the left part 12 of the block, the heater insert hole 12b is disposed in a position close to the recessed section 16, so that the heater 41 can heat the image pickup element 21 readily.

Signal Processing Substrate

Figure 10:
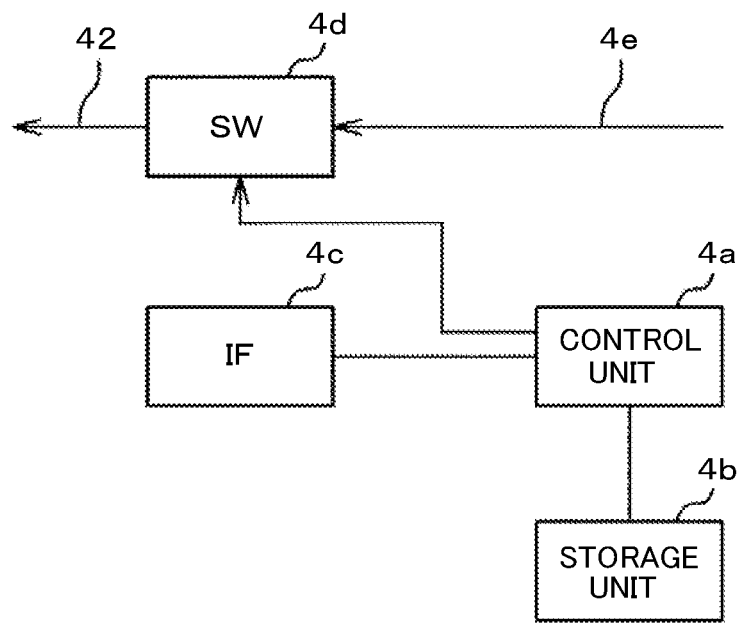
FIG. 10 is a diagram depicting a functional structure of a signal processing substrate according to the first embodiment of the present invention.

FIG. 10 is a diagram depicting a functional structure of the signal processing substrate according to the first embodiment of the present invention. As depicted in FIG. 10, the signal processing substrate 4 is configured to include a control unit 4a, a storage unit 4b, an IF unit 4c, a switch 4d, and a power supply line 4e.

The IF unit 4c is an interface (IF) unit to send and receive diverse signals to/from the image pickup element substrate 20. For instance, the IF unit 4c receives from the image pickup element substrate 20 temperature information detected by the temperature sensor 22 on the image pickup element substrate 20 and transfers that information to the control unit 4a.

The switch 4d is provided between the heater cable 42 and the power supply line 4e. The power supply line 4e is to supply electric power from a power supply device (not depicted), for example, installed on the housing 2 and supplies electric power to the heater 41, image pickup element substrate 20, and signal processing substrate 4. The switch 4d switches between a state (On state) of conducting electric power which is supplied through the power supply line 4e to the heater cable 42 and a state (Off state) of not conducting electric power, according to an instruction from the control unit 4a. That is, the switch 4d switches between the On state in which electric power is supplied to the heater 41 and the Off state in which electric power is not supplied to the heater 41.

The storage unit 4b stores a temperature (upper limit temperature) given by the temperature sensor 22 when the switch 4d switches from the On state to the Off state and a temperature (lower limit temperature) given by the temperature sensor 22 when the switch 4d switches from the Off state to the On state. The storage unit 4b is configured with a semiconductor memory, a hard disk device, or the like.

The control unit 4a connects by signal lines with all components constituting the signal processing substrate 4 and controls the components. Besides, the control unit 4a instructs the switch 4d to switch to the Off state when temperature given by the temperature sensor 22 has become up to the upper limit temperature. Besides, the control unit 4a instructs the switch 4d to switch to the On state when temperature given by the temperature sensor 22 has become down to the lower limit temperature. As hardware structure, the control unit 4a includes a CPU (Central Processing Unit) and a memory which stores an operating program or the like for the control unit 4a and the CPU operates in accordance with the operating program.

As noted above, a configuration is made so that the heater 41 will be turned On or Off depending on the temperature of the image pickup element 21 detected by the temperature sensor 22; thus, even in a case where there is a large change in the ambient temperature of the camera 1, it would become easy to adjust the temperature of the image pickup element 21 within a specified temperature range.

Besides, as described previously, a configuration is made such that, on the image pickup element substrate 20, the temperature sensor is provided in a position facing the image pickup element 21 with the intermediate positioning of the temperature adjusting block 10; thus, the temperature of the image pickup element 21 can be detected more accurately.

Heat Analysis Results

Results of heat analysis on the camera 1 of the first embodiment are described. The camera 1 of the first embodiment depicted in FIG. 1 is installed on the outside of a vehicle such as, e.g., a railroad vehicle. Its required operating temperature range (specified) is from −25° C. to +55° C. and its operation assurance temperature range is from −10° C. to +60° C. As will be described below, in the camera 1 of the first embodiment, the temperature of the image pickup element 21 can be made to fall within the operation assurance temperature range in a case where the camera is used on a railroad vehicle running in a low-temperature environment or even in a case where the camera is used in a high-temperature environment.

For an instance where a railroad vehicle on which a camera 1 not equipped with the heater 41 was mounted runs at a speed of 240 km/h under an outdoor air temperature of −25° C., its heat analysis indicates that the temperature of the image pickup element 21 becomes −21.7° C., taking the effect of cooling during running into consideration; that temperature falls outside the operation assurance temperature range of the image pickup element 21. However, for the camera equipped with the heater 41 and adapted such that heating at 5 W is performed by the heater 41, its heat analysis indicates that the temperature of the image pickup element 21 becomes −8.3° C. which falls within the operation assurance temperature range of the image pickup element 21.

For an instance where the temperature of the image pickup element 21 becomes so high, for example, where a railroad vehicle is at a stop under an outside air temperature of 55° C., its heat analysis indicates that the temperature of the image pickup element 21 becomes 59.4° C. which falls within the operation assurance temperature range of the image pickup element 21. As noted above, it can be made sure by heat analysis that the camera 1 of the first embodiment is capable of sufficiently providing the performance of cooling the image pickup element 21 as well.

Although the heater 41 is located inside the left part 12 of the block in the configuration of the first embodiment described above, the heater 41 may be located inside the right part 11 of the block in another configuration. Besides, depending on a temperature environment in which the camera 1 is used, a configuration is possible in which the heater 41 is located both inside the right part 11 and inside the left part 12 of the block or a configuration is also possible in which the heater 41 is not provided.

Although the heater 41 is buried inside the left part 12 of the block in the configuration of the first embodiment described above, the heater 41 may be put in contact with the surface of the left part 12 of the block without being buried inside the left part 12 of the block in another configuration.

Although the recessed section 16 for housing the image pickup element 21 among others is provided in the central part of the temperature adjusting block 10 in the first embodiment described above, the recessed section 16 may be provided in another position than in the central part, for example, in a rightward position of the temperature adjusting block 10 in another configuration. In this case, the back surface and lateral sides of the image pickup element 21 can still be surrounded by the temperature adjusting block 10, though the width of the right part 11 of the block in an X direction becomes smaller.

According to the first embodiment, advantageous effects, at least as set forth below, can be obtained.

(A1) In the described configuration, the image pickup element 21 is placed inside the recessed section 16 provided in the temperature adjusting block 10 and the back surface and lateral sides of the image pickup element 21 are surrounded by the temperature adjusting block 10. Thus, heat exchange between the temperature adjusting block 10 and the image pickup element 21 can take place efficiently and the temperature of the image pickup element 21 can be adjusted efficiently.

(A2) Moreover, with respect to the Y direction, the thickness of the recessed section of the temperature adjusting block 10 was made thicker than the thickness of the image pickup element 21. Thus, heat exchange between the temperature adjusting block 10 and the image pickup element 21 can take place more efficiently.

(A3) Since, in the described configuration, the heater 41 is buried inside the non-recessed body of the temperature adjusting block 10, the heater 41 would be easy to fix. Besides, heat from the heater 41 can efficiently be transferred to the temperature adjusting block 10.

(A4) Since, in the described configuration, the heater 41 is turned On or OFF depending on the temperature of the image pickup element 21 detected by the temperature sensor, the temperature of the image pickup element 21 can be adjusted more properly.

(A5) In the described configuration, on the surface of the image pickup element substrate 20, opposite to the image pickup element 21, the temperature sensor is provided in a position facing the image pickup element 21. Thus, the temperature of the image pickup element 21 can be detected more accurately.

(A6) Because of the increased heat capacity of the temperature adjusting block 10 by making the thickness of the temperature adjusting block 10 in the Y direction thicker, the amount of heat exchange per unit time between the image pickup element 21 and the temperature adjusting block 10 is less likely be affected by other environments. Hence, even in a case where the temperature of the image pickup element 21 has changed rapidly for a short time, it is possible to suppress the rapid temperature change of the image pickup element 21.

Second Embodiment

Figure 11:
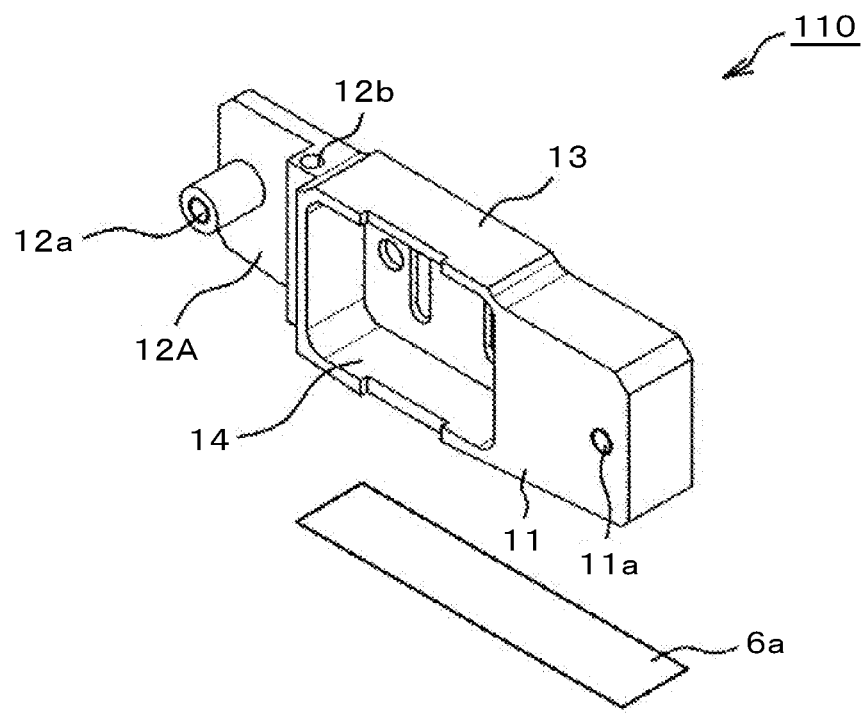
FIG. 11 is a perspective view depicting a temperature adjusting block according to a second embodiment of the present invention.

Then, using FIG. 11, descriptions are provided about a camera according to a second embodiment of the present invention. In the first embodiment, when the left part 12 of the block is heated by the heater 41, the heat of the left part 12 of the block is not only transferred to the image pickup element 21, but also transferred to the housing 2 through the second fixing bracket 60 and the heat dissipation sheet 6a. Consequently, if the temperature of environment where the camera 1 is used is considerably low, the left part 12 of the block is hard to heat or the amount of heat generation of the heater 31 has to be increased.

Therefore, in the second embodiment, a structure is adopted in which heat of the left part 12 in which the heater 41 resides, of the block, is less likely to be dissipated. The camera of the second embodiment differs from the camera of the first embodiment only in the structure of the temperature adjusting block. Other components are the same as in the first embodiment and their description is omitted.

FIG. 11 is a perspective view depicting a temperature adjusting block according to the second embodiment of the present invention. As depicted in FIG. 11, in the temperature adjusting block 110 of the second embodiment, only the left part 12A of the block differs from the left part 12 of the temperature adjusting block 10 of the first embodiment. That is, the thickness (length in the Y direction) of the left part 12A of the block is thinner than the right part 11 of the block and thinner than the left part 12 of the block of the first embodiment.

More specifically, of the left part 12A of the block, a portion surrounding the heater insert hole 12b remains the same as the shape of the corresponding portion of the left part 12 of the block of the first embodiment and the thickness of a portion nearer to the end face than the portion surrounding the heater insert hole 12b is thinner than the right part 11 of the block and thinner than the left part 12 of the block of the first embodiment. That is, the solid volume of the left part 12A of the block is smaller than that of the right part 11 of the block and smaller than that of the left part 12 of the block of the first embodiment.

Thereby, a contact area of the left part 12A of the block contacting with the bottom plate 61 of the second fixing bracket 60 becomes smaller than a contact area of the right part 11 of the block contacting with the bottom plate 61 and smaller than a contact area of the left part 12 of the block of the first embodiment contacting with the bottom plate 61. Hence, a coefficient of heat transfer from the left part 12A of the block to the bottom plate 61 becomes smaller than a coefficient of heat transfer from the right part 11 of the block to the bottom plate 61 and smaller than a coefficient of heat transfer from the left part 12 of the block of the first embodiment to the bottom plate 61.

Besides, the heat capacity of the left part 12A of the block becomes smaller than the heat capacity of the right part 11 of the block and smaller than the heat capacity of the left part 12 of the block of the first embodiment. Hence, the efficiency at which the left part 12A of the block heats the image pickup element 21 becomes larger than the efficiency at which the left part 12 of the block of the first embodiment heats the image pickup element 21.

Besides, in the second embodiment, a heat dissipation sheet 6a which is placed between the second fixing bracket 60 and the housing 2 is shaped, tailored to the shape of the left part 12A of the block. That is, the longitudinal length (in the X direction) of the heat dissipation sheet 6a is made shorter than the longitudinal length of the heat dissipation sheet 6 of the first embodiment. The heat dissipation sheet 6a is thus adapted to be placed under the bottom part 14 and the right part 11 of the block, but not to be placed under the most part of the left part 12A of the block. In other words, an arrangement is made so that the area of the heat dissipation sheet placed under the left part 12A in which the heater 41 is installed, of the block, becomes smaller than the area of the heat dissipation sheet placed under the right part 11 in which the heater 41 is not installed, of the block.

As noted above, by thinning the thickness of the left part 12A of the block and shrinking the area of the heat dissipation sheet 6a placed under the left part 12A of the block, the heat dissipation capability of the left part 12A of the block is made smaller than the heat dissipation capability of the right part 11 of the block and the heat dissipation capability of the left part 12 of the block of the first embodiment. That is, heat that is transferred from the left part 12A of the block to the hosing 2 is made less than heat that is transferred from the right part 11 of the block to the housing 2 and heat that is transferred from the left part 12 of the block of the first embodiment to the housing 2.

According to the second embodiment, an advantageous effect, at least as set forth below, can be obtained.

(B1) Since heat that is transferred from the left part 12A of the block to the hosing 2 is diminished, it would be easy to adjust the image pickup element 21 to a proper temperature, even if the temperature of environment where the camera is used is low.

Third Embodiment

Figure 12:
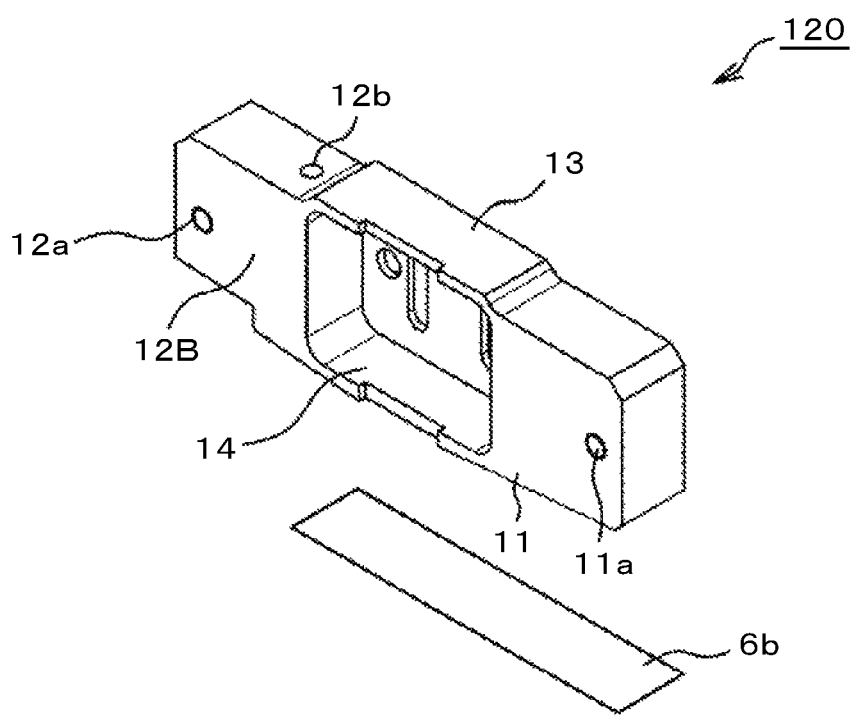
FIG. 12 is a perspective view depicting a temperature adjusting block according to a third embodiment of the present invention.

Then, using FIG. 12, descriptions are provided about a camera according to a third embodiment of the present invention. The camera of the third embodiment differs from the camera of the first embodiment only in the structure of the temperature adjusting block. Other components are the same as in the first embodiment and their description is omitted.

FIG. 12 is a perspective view depicting a temperature adjusting block according to the third embodiment of the present invention. As depicted in FIG. 12, in the temperature adjusting block 120 of the third embodiment, only the left part 12B of the block differs from the left part 12 of the temperature adjusting block 10 of the first embodiment. That is, the left part 12B of the block has a shape such that a part of its bottom section was cut off and is so formed as not to contact with the bottom plate 61 of the second fixing bracket 60.

More specifically, a portion surrounding the heater insert hole 12b remains the same as the shape of the corresponding portion of the left part 12 of the block of the first embodiment and a portion nearer to the end face than the portion surrounding the heater insert hole 12b has a shape such that the bottom section of the left part 12B of the block was cut off to a uniform thickness.

Thereby, a coefficient of heat transfer from the left part 12B of the block to the bottom plate 61 becomes smaller than a coefficient of heat transfer from the right part 11 of the block to the bottom plate 61 and smaller than a coefficient of heat transfer from the left part 12 of the block of the first embodiment to the bottom plate 61.

Besides, in the third embodiment, a heat dissipation sheet 6b which is placed between the second fixing bracket 60 and the housing 2 is shaped, tailored to the shape of the bottom surface of the left part 12B of the block. That is, the longitudinal length (in the X direction) of the heat dissipation sheet 6b is made shorter than the longitudinal length of the heat dissipation sheet 6 of the first embodiment. The heat dissipation sheet 6b is thus adapted to be placed under the bottom part 14 and the right part 11 of the block, but not to be placed under the most part of the left part 12B of the block.

As noted above, in the third embodiment, the temperature adjusting block is formed such that the bottom section of the left part 12B of the block does not contact with the bottom plate 61 and the heat dissipation sheet 6b is not placed under the most part of the left part 12B of the block. Thereby, heat that is transferred from the left part 12B of the block to the hosing 2 is made less than heat that is transferred from the right part 11 of the block to the housing 2 and heat that is transferred from the left part 12 of the block of the first embodiment to the housing 2.

According to the third embodiment, an advantageous effect, at least as set forth below, can be obtained.

(C1) Since heat that is transferred from the left part 12B of the block to the hosing 2 is diminished, it would be easy to adjust the image pickup element 21 to a proper temperature, even if the temperature of environment where the camera is used is low.

The present invention is not limited to the forgoing embodiments and various modifications may be made thereto without departing from the gist of the invention. Besides, each of the components of each of the foregoing embodiments may be combined optionally and appropriately as necessary.

Although the temperature adjusting block is fixed to the housing by means of the fixing brackets in the foregoing embodiments, the temperature adjusting block may be fixed directly to the housing without the intermediary of the fixing brackets in another configuration.

Although the heat dissipation sheet is placed between the fixing brackets and the hosing in the foregoing embodiments, the heat dissipation sheet may be dispensed with in another configuration.

INDUSTRIAL APPLICABILITY

The present invention can be applied to a surveillance camera o the like that carries out video image monitoring.

REFERENCE SIGNS LIST

1: camera (image pickup apparatus),
2: housing,
2a: screw hole,
3: cover,
4: signal processing substrate,
4a: control unit,
4b: storage unit,
4c: IF unit,
4d: switch,
4e: power supply line,
5: wiring cable,
6, 6a, 6b: heat dissipation sheet,
10: temperature adjusting block (temperature adjusting member),
10a: lateral sides of recessed section,
11: right part of the block,
11a: screw hole,
12: left part of the block,
12a: screw hole,
12b: heater insert hole,
13: top part of the block,
14: bottom part of the block,
15: rear part of the block,
15a: terminal through-hole,
15b: screw hole,
16: recessed section,
20: image pickup element substrate,
20a: surface,
20b: underside surface,
21: image pickup element,
21a: terminal,
22: temperature sensor,
24: connector,
30: lens unit,
31: lens mount,
32: imaging lens,
33: glass frame,
34: glass,
35: glass holder,
40: heater unit,
41: heater (heat generating member),
42: heater able,
43: shock absorbing material,
50: first fixing bracket,
51: front plate,
51a: screw hole,
51b: lens hole,
52: side plate,
52a: screw hole,
60: second fixing bracket,
61: bottom plate,
62: side plate,
63: bracket attachment lug,
63a: screw hole,
64: bracket attachment lug,
64a: screw hole,
70: image pickup element unit,
91a to 91d, 92a, 92d, 94: screw
110: temperature adjusting block (temperature adjusting member),
120: temperature adjusting block (temperature adjusting member).

The invention claimed is:

1. An image pickup element unit, comprising:
an image pickup element substrate having an image pickup element to convert incident light into electric signals mounted thereto and a temperature adjusting member for adjusting the temperature of the image pickup element,
wherein the temperature adjusting member has a recessed section and is configured to comprise a left side member, a right side member, a top side member, a bottom side member, and a rear side member with respect to the recessed section,
wherein a heat generating member is installed in the left side member or the right side member,
wherein the image pickup element is placed so as to be surrounded by the left side member, the right side member, the top side member, the bottom side member, and the rear side member and is fixed to the image pickup element substrate with the intermediate positioning of the rear side member,
wherein a temperature sensor for detecting the temperature of the image pickup element is provided on the image pickup element substrate, and
wherein, on the surface of the image pickup element substrate, opposite to the image pickup element, the temperature sensor is provided in a position facing the image pickup element.

2. The image pickup element unit according to claim 1, wherein the height of the image pickup element is lower than the height of every one of the left side member, the right side member, the top side member, and the bottom side member.

3. The image pickup element unit according to claim 1, wherein the heat generating member is buried in the left side member or the right side member.

4. An image pickup element unit, comprising:
an image pickup element substrate having an image pickup element to convert incident light into electric signals mounted thereto and a temperature adjusting member for adjusting the temperature of the image pickup element,
wherein the temperature adjusting member has a recessed section and is configured to comprise a left side member, a right side member, a top side member, a bottom side member, and a rear side member with respect to the recessed section, wherein a heat generating member is installed in the left side member or the right side member, wherein the image pickup element is placed so as to be surrounded by the left side member, the right side member, the top side member, the bottom side member, and the rear side member and is fixed to the image pickup element substrate with the intermediate positioning of the rear side member, and wherein the heat generating member is installed only in either the left side member or the right side member and the solid volume of the left side member or the right side member with the heat generating member installed therein is smaller than that of the right side member or the left side member in which the heat generating member is not installed.

5. An image pickup apparatus, comprising:

an image pickup element substrate having an image pickup element to convert incident light into electric signals mounted thereto, a signal processing substrate which processes electric signals from the image pickup element, a temperature adjusting member for adjusting the temperature of the image pickup element, and a housing which houses the image pickup element substrate, the signal processing substrate, and the temperature adjusting member, wherein the temperature adjusting member has a recessed section and is configured to comprise a left side member, a right side member, a top side member, a bottom side member, and a rear side member with respect to the recessed section, wherein a heat generating member is installed in the left side member or the right side member, wherein the image pickup element is placed so as to be surrounded by the left side member, the right side member, the top side member, the bottom side member, and the rear side member and is fixed to the image pickup element substrate with the intermediate positioning of the rear side member, wherein a temperature sensor for detecting the temperature of the image pickup element is provided on the image pickup element substrate, and wherein, on the signal processing substrate, a control unit is provided which switches between an On state in which electric power is supplied to the heat generating member and an Off state in which electric power is not supplied to the heat generating member, according to temperature detected by the temperature sensor.

6. The image pickup apparatus according to claim 5, wherein the height of the image pickup element is lower than the height of every one of the left side member, the right side member, the top side member, and the bottom side member.

7. The image pickup apparatus according to claim 5, wherein the heat generating member is buried in the left side member or the right side member.

8. An image pickup apparatus, comprising:

an image pickup element substrate having an image pickup element to convert incident light into electric signals mounted thereto, a signal processing substrate which processes electric signals from the image pickup element, a temperature adjusting member for adjusting the temperature of the image pickup element, and a housing which houses the image pickup element substrate, the signal processing substrate, and the temperature adjusting member, wherein the temperature adjusting member has a recessed section and is configured to comprise a left side member, a right side member, a top side member, a bottom side member, and a rear side member with respect to the recessed section, wherein a heat generating member is installed in the left side member or the right side member, wherein the image pickup element is placed so as to be surrounded by the left side member, the right side member, the top side member, the bottom side member and the rear side member, and is fixed to the image pickup element substrate with the intermediate positioning of the rear side member, and wherein the heat generating member is installed only in either the left side member or the right side member and the heat dissipation capability of the left side member or the right side member with the heat generating member installed therein is smaller than that of the right side member or the left side member in which the heat generating member is not installed.

9. The image pickup apparatus according to claim 8, further comprising a fixing bracket for fixing the temperature adjusting member to the housing, wherein a contact area between the left side member or the right side member with the heat generating member installed therein and the fixing bracket is smaller than a contact area between the right side member or the left side member in which the heat generating member is not installed and the fixing bracket.

10. The image pickup apparatus according to claim 8, further comprising a heat dissipation sheet which is provided between the fixing bracket and the housing, wherein the area of the heat dissipation sheet placed under the left side member or the right side member with the heat generating member installed therein is smaller than the area of the heat dissipation sheet placed under the right side member or the left side member in which the heat generating member is not installed.

* * * * *